United States Patent
Morimoto et al.

(10) Patent No.: US 6,980,057 B2
(45) Date of Patent: Dec. 27, 2005

(54) POWER AMPLIFIER, POWER DISTRIBUTOR, AND POWER COMBINER

(75) Inventors: Shigeru Morimoto, Ibaraki (JP); Hisashi Adachi, Mino (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 32 days.

(21) Appl. No.: 10/872,380

(22) Filed: Jun. 22, 2004

(65) Prior Publication Data
US 2004/0263255 A1    Dec. 30, 2004

(30) Foreign Application Priority Data
Jun. 26, 2003 (JP) ............................. 2003-183231

(51) Int. Cl.[7] .............................. H03F 3/60; H03F 3/68; H01P 5/12
(52) U.S. Cl. ............... 330/286; 330/295; 330/124 R; 333/136
(58) Field of Search ............................. 330/286, 295, 330/124 R; 333/136, 25, 219

(56) References Cited

U.S. PATENT DOCUMENTS

| | | | |
|---|---|---|---|
| 5,274,341 A | * | 12/1993 | Sekine et al. ............ 330/269 |
| 6,201,445 B1 | * | 3/2001 | Morimoto et al. ............ 330/295 |
| 6,275,118 B1 | * | 8/2001 | Saito et al. ............ 331/96 |
| 6,529,051 B2 | * | 3/2003 | Tokumitsu et al. ............ 327/119 |
| 6,798,305 B2 | * | 9/2004 | Aikawa et al. ............ 331/117 D |

FOREIGN PATENT DOCUMENTS

JP          5-029851          2/1993

* cited by examiner

Primary Examiner—Patricia Nguyen
(74) Attorney, Agent, or Firm—Wenderoth, Lind & Ponack, L.L.P.

(57) ABSTRACT

In a power amplifier of the present invention, distributed constant lines 105a and 105b have a total line length corresponding to a ½ wavelength of a fundamental wave so as to invert the phase of a fundamental wave component of a first signal amplified by a first amplification element 102a. A series resonant circuit 106 is connected a tone end between the distributed constant lines 105a and 105b, which invert the phase of a second-order harmonic component, so as to be in parallel connection with the distributed constant lines 105a and 105b. Further, the series resonant circuit 106 is connected at the other end to an output side of the second amplification element 102b. The series resonant circuit 106 resonates with a second-order harmonic frequency, thereby canceling out the second-order harmonic component.

20 Claims, 6 Drawing Sheets

1

POWER AMPLIFIER, POWER DISTRIBUTOR, AND POWER COMBINER

BACKGROUND OF THE INVENTION

1. Field of the Invention

The present invention relates to a high frequency power amplifier, and more particularly to a push-pull type high frequency power amplifier, and a power distributor and a power combiner for use therein.

2. Description of the Background Art

FIG. 6 is a diagram showing a structure of a conventional push-pull type high frequency power amplifier. In FIG. 6, a conventional power amplifier 9 includes: an input terminal 900; a balun/matching circuit 901; field-effect transistors (FETs) 902a and 902b of the same specification; inductors 903a and 903b respectively connected to drains of the FETs 902a and 902b; an output terminal 904; a distributed constant line 905 connected between the output terminal 904 and the drain of the FET 902a; a series resonant circuit 906a connected between the distributed constant line 905 and the drain of the FET 902a so as to be in parallel connection with the distributed constant line 905 and the FET 902a; and a series resonant circuit 906b connected between the output terminal 904 and the drain of the FET 902b so as to be in parallel connection with the output terminal 904 and the FET 902b.

The balun/matching circuit 901 inverts the phase of a fundamental wave inputted into the input terminal 900, and outputs first and second signals having fundamental wave components inverted in phase with respect to each other. The first and second signals are respectively amplified by the FETs 902a and 902b. In this case, it is assumed that a wavelength of the fundamental wave is λ, and the distributed constant line 905 has a length corresponding to a ½ wavelength of the fundamental wave, i.e., λ/2. The distributed constant line 905 shifts a phase of a fundamental wave of a signal outputted from the FET 902a by 180 degrees, and then combines the signal with a signal outputted from the FET 902b. A resultant signal is outputted from the output terminal 904.

Where the fundamental wave has a frequency of f0 (=1/λ), the series resonant circuits 906a and 906b are configured so as to resonate with a frequency of 2f0, i.e., twice the frequency of the fundamental wave. Accordingly, second-order harmonics generated by the amplification elements 902a and 902b, which are in phase with each other, are canceled out in the series resonant circuits 906a and 906b. Therefore, the conventional power amplifier 9 shown in FIG. 6 is able to suppress generation of second-order distortion.

FIG. 7 is a diagram showing a structure of a conventional push-pull type power amplifier including a matching circuit with consideration of a harmonic impedance (see, for example, Japanese Patent Laid-Open Publication No. 5-29851). In the conventional power amplifier shown in FIG. 7, a fundamental wave inputted into an input terminal 911 is separated by a phase inversion circuit 912 into two signals inverted in phase with respect to each other. The two signals are outputted from the phase inversion circuit 912 through matching circuits 913 and 914 to FETs 915 and 916, respectively.

The FET 915 has a drain connected to a distributed constant line 917, and the FET 916 has a drain connected to a distributed constant line 918. A stab 919 having a length of L2, which corresponds to a ¼ wavelength of the fundamental wave, is connected to the distributed constant line 917 at a point at a distance of L1, which corresponds to an integral multiple of a ¼ wavelength of the fundamental wave, from an end connected to the FET 915. A stab 920 having a length of L2, which corresponds to a ¼ wavelength of the fundamental wave, is connected to the distributed constant line 918 at a point at a distance of L1, which corresponds to an integral multiple of a ¼ wavelength of the fundamental wave, from an end connected to the FET 916. Each of the stabs 919 and 920 has one end short-circuited, and acts as a short-circuit for an even-ordered harmonic.

Further, in order for the distributed constant lines 917 and 918 to be open for a third-order harmonic, a capacitor 921 is connected between the distributed constant lines 917 and 918 at points at a distance of L3, which corresponds to a ¹⁄₁₂ wavelength of the fundamental wave, from either of the ends respectively connected to the FETs 915 and 916. Moreover, a capacitor 922 is connected between the distributed constant lines 917 and 918 in order to achieve an impedance match with the fundamental wave in a portion between a connection point to the capacitor 921 and a connection point to either of the stubs 919 and 920. In a phase inverter 923, signals from the distributed constant lines 917 and 918 are brought into phase with each other, and combined into a signal which is outputted from an output terminal 924.

In the conventional power amplifier shown in FIG. 7, if gate voltages of the FETs 915 and 916 are set so as to be at a pitch-off point and large input signals are applied to the FETs 915 and 916, a drain voltage vd and a drain current id of each of the FETs 915 and 916 show waveforms as shown in FIG. 8. Specifically, a waveform of the drain voltage vd has a rectangular shape and includes fundamental wave components and odd-ordered harmonic components. A waveform of the drain current id has a half-wave rectified shape and includes fundamental wave components and even-ordered harmonic components. Thus, the drain voltage vd and the drain current id do not exist simultaneously in an amplification element, so that substantially no power is consumed by the amplification element, whereby it is possible to achieve substantially a 100% efficiency.

In the conventional power amplifier shown in FIG. 6, in order to use an impedance as a short-circuit for a second-order harmonic, it is necessary to provide the series resonant circuits 906a and 906b to a pair of FETs.

In the conventional power amplifier shown in FIG. 7, in order to use an impedance as a short-circuit for an even-ordered harmonic, it is necessary to provide the stabs 919 and 920 to a pair of FETs.

Thus, a circuit size is increased in each of the above-described conventional power amplifiers.

In each of the above paired series resonant circuits and the above paired stabs, both elements of the pair are required to have the same characteristic. However, in an amplifier modularized by means of integration, paired series resonant circuits or paired stubs may have high frequency characteristics slightly different from each other due to influence of a part adjacent thereto, for example. This might cause variation of a gain characteristic of the conventional power amplifier.

SUMMARY OF THE INVENTION

Therefore, an object of the present invention is to provide a high efficiency amplifier with a compact size and a narrow range of characteristic variation.

Another object of the present invention is to provide a power distributor and a power combiner for use in the same power amplifier.

The present invention has the following features to attain the object mentioned above.

A first aspect of the present invention is directed to a power amplifier for amplifying a high frequency signal. The power amplifier includes: a first amplification element for amplifying a first signal; a second amplification element for amplifying a second signal in reverse phase with respect to the first signal, the second amplification element being connected to the first amplification element in a push-pull configuration; a first distributed constant line having a line length for inverting a phase of a fundamental wave component of the first signal amplified by the first amplification element; a first resonant circuit connected between an output end of the second amplification element and a point on the first distributed constant line at which a phase of an even-ordered harmonic component desired to be canceled out is inverted, the first resonant circuit series-resonating with a frequency of the even-ordered harmonic component desired to be canceled out; and an output terminal for outputting a combined signal obtained by combining a signal from the first distributed constant line with a signal from the second amplification element.

In the push-pull type power amplifier according to the first aspect, even-ordered harmonics generated in the first and second amplification elements are canceled out by one resonant circuit which series-resonates with a frequency of a desired even-numbered harmonic, and is connected to a point at which a phase of the even-ordered harmonic is inverted. In this manner, one resonant circuit makes it possible to suppress generation of even-ordered harmonic distortion, whereby it is possible to provide a compact power amplifier. Further, it is possible to reduce a characteristic variation as compared to a case of providing each of the two amplification elements used in the push-pull type power amplifier with a resonant circuit for suppressing generation of the even-ordered harmonic distortion.

Preferably, the line length of the first distributed constant line corresponds to a ½ wavelength of the fundamental wave, the point at which the first resonant circuit is connected to the first contributed constant line is at a distance of a ¼ wavelength of the fundamental wave from an end of the first distributed constant line, and the first resonant circuit series-resonates with a second-order harmonic frequency.

Since the line length of the first distributed constant line corresponds to a ½ wavelength of the fundamental wave, the phase of a fundamental wave of the first signal is shifted by 180 degrees. Further, since the first resonant circuit is connected to the point at a distance of a ¼ wavelength of the fundamental wave, i.e., a ½ wavelength of the second-order harmonic, from an end of the first distributed constant line, the second-order harmonics at opposite ends of the first resonant circuit are 180 degrees out of phase with each other. Furthermore, since the first resonant circuit is configured so as to series-resonate with a second-order harmonic frequency, and therefore acts as a short-circuit for the second-order harmonic. Therefore, the second-order harmonic is canceled out at an output end of each of the first and second amplification elements. Thus, it is possible to provide a compact power amplifier including one resonate circuit which achieves an effect similar to that achieved by providing the resonate circuit at an output end of each amplification element.

Preferably, the first resonant circuit may be a series resonant circuit including inductors and one capacitor which are arranged in a symmetrical manner or including one inductor and capacitors which are arranged in a symmetrical manner. Thus, it is possible to prevent a mismatch between impedances seen from both ends of the first resonant circuit.

Preferably, the first resonant circuit may be a distributed constant line having an electrical length equal to a ½ wavelength of the even-ordered harmonic component desired to be canceled out. Thus, it is possible to prevent a mismatch between impedances seen from both ends of the first resonant circuit, and also to reduce the number of elements used in the resonant circuit.

Preferably, the power amplifier further includes a power distributor for inputting the first and second signals into the first and second amplification elements, respectively, and the power distributor includes: a distribution section for separating an inputted signal into two signals and for inputting one of the two signals as the first signal into the first amplification element; a second distributed constant line having a line length for inverting a phase of a fundamental wave component of another one of the two signals from the distribution section, and inputting the fundamental wave component, which has its phase inverted, as the second signal into the second amplification element; and a second resonant circuit connected between an input end of the second amplification element and a point on the second distributed constant line at which a phase of an even-ordered harmonic component desired to be canceled out is inverted, the second resonant circuit series-resonating with a frequency of the even-ordered harmonic component desired to be canceled out.

Thus, the even-ordered harmonics of the inputted first and second signals are cancelled out. In the power distributor for inputting the first and second signals, even-ordered harmonics generated in the first and second amplification elements are canceled out by one resonant circuit which series-resonates with a frequency of a desired even-numbered harmonic, and is connected to a point at which a phase of the even-ordered harmonic is inverted. In this manner, one resonant circuit makes it possible to suppress generation of even-ordered harmonic distortion, whereby it is possible to provide a compact power amplifier having the power distributor included therein. Further, since only one resonant circuit is used, it is possible to reduce a characteristic variation.

Preferably, the line length of the second distributed constant line corresponds to a ½ wavelength of the fundamental wave, the point at which the second resonant circuit is connected to the second contributed constant line is at a distance of a ¼ wavelength of the fundamental wave from an end of the second distributed constant line, and the second resonant circuit series-resonates with a second-order harmonic frequency.

Since the line length of the second distributed constant line corresponds to a ½ wavelength of the fundamental wave, the phase of a fundamental wave of an inputted signal is shifted by 180 degrees. Further, since the second resonant circuit is connected to the point at a distance of a ¼ wavelength of the fundamental wave, i.e., a ½ wavelength of the second-order harmonic, from an end of the second distributed constant line, the second-order harmonics at opposite ends of the second resonant circuit are 180 degrees out of phase with each other. Furthermore, since the second resonant circuit is configured so as to series-resonate with a second-order harmonic frequency, and therefore acts as a short-circuit for the second-order harmonic. Therefore, the second-order harmonic is canceled out at an input end of each of the first and second amplification elements. Thus, it is possible to provide a compact power amplifier capable of suppressing generation of second-order harmonic distortion.

Preferably, the second resonant circuit may be a series resonant circuit including inductors and one capacitor which are arranged in a symmetrical manner or including one inductor and capacitors which are arranged in a symmetrical manner. Thus, it is possible to prevent a mismatch between impedances seen from both ends of the second resonant circuit.

Preferably, the second resonant circuit may be a distributed constant line having an electrical length equal to a ½ wavelength of the even-ordered harmonic component desired to be canceled out. Thus, it is possible to prevent a mismatch between impedances seen from both ends of the second resonant circuit, and also to reduce the number of elements used in the resonant circuit.

A second aspect of the present invention is directed to a power amplifier for amplifying a high frequency signal. The power amplifier includes: a power distributor for outputting a first signal and a second signal in reverse phase with respect to the first signal; a first amplification element for amplifying the first signal; a second amplification element for amplifying the second signal, the second amplification element being connected to the first amplification element in a push-pull configuration; and a power combiner for inverting a phase of a fundamental wave component of the first signal amplified by the first amplification element and outputting a combined signal obtained by combining the first signal having its fundamental wave inverted in phase with the second signal amplified by the second amplification element. The power distributor includes: a distribution section for separating an inputted signal into two signals and for inputting one of the two signals as the first signal into the first amplification element; a distributed constant line having a line length for inverting a phase of a fundamental wave component of another one of the two signals from the distribution section, and inputting the fundamental wave component, which has its phase inverted, as the second signal into the second amplification element; and a resonant circuit connected between the input end of the second amplification element and a point on the distributed constant line at which a phase of an even-ordered harmonic component desired to be canceled out is inverted, the resonant circuit series-resonating with a frequency of the even-ordered harmonic component desired to be canceled out.

According to the second aspect, it is possible to provide a power amplifier having included therein a power distributor which suppresses generation of even-ordered harmonic distortion.

Preferably, the line length of the distributed constant line may correspond to a ½ wavelength of the fundamental wave, the point at which the resonant circuit is connected to the contributed constant line may be at a distance of a ¼ wavelength of the fundamental wave from an end of the distributed constant line, and the resonant circuit may series-resonate with a second-order harmonic frequency. Thus, it is possible to provide a power distributor which suppresses generation of second-order harmonic distortion.

Preferably, the resonant circuit may be a series resonant circuit including inductors and one capacitor which are arranged in a symmetrical manner or including one inductor and capacitors which are arranged in a symmetrical manner. Thus, it is possible to prevent a mismatch between impedances seen from both ends of the resonant circuit.

Preferably, the resonant circuit may be a distributed constant line having an electrical length equal to a ½ wavelength of the even-ordered harmonic component desired to be canceled out. Thus, it is possible to prevent a mismatch between impedances seen from both ends of the second resonant circuit, and also to reduce the number of elements used in used in the resonant circuit.

A third aspect of the present invention is directed to a power distributor for separating an inputted signal into two signals. The power distributor includes: a distribution section for separating the inputted signal into the two signals; a first output terminal for outputting, as a first signal, one of the two signals obtained by separation via the distribution section; a distributed constant line having a line length for inverting a phase of a fundamental wave component of another one of the two signals obtained by separation via the distribution section, thereby converting the fundamental wave, which has its phase inverted, into a second signal; a second output terminal for outputting the second signal derived from the distributed constant line; and a resonant circuit connected between the first output terminal and a point on the distributed constant line at which a phase of an even-ordered harmonic component desired to be canceled out is inverted, the resonant circuit series-resonating with a frequency of the even-ordered harmonic component desired to be canceled out.

According to the third aspect, it is possible to provide a power distributor which suppresses generation of even-ordered harmonic distortion.

Preferably, the line length of the distributed constant line corresponds to a ½ wavelength of the fundamental wave, the point at which the resonant circuit is connected to the contributed constant line is at a distance of a ¼ wavelength of the fundamental wave from an end of the distributed constant line, and the resonant circuit series-resonates with a second-order harmonic frequency.

Thus, it is possible to provide a power distributor which suppresses generation of second-order harmonic distortion.

Preferably, the resonant circuit may be a series resonant circuit including inductors and one capacitor which are arranged in a symmetrical manner or including one inductor and capacitors which are arranged in a symmetrical manner. Thus, it is possible to prevent a mismatch between impedances seen from both ends of the resonant circuit.

Preferably, the resonant circuit may be a distributed constant line having an electrical length equal to a ½ wavelength of the even-ordered harmonic component desired to be canceled out. Thus, it is possible to prevent a mismatch between impedances seen from both ends of the resonant circuit, and also to reduce the number of elements used in used in the resonant circuit.

A fourth aspect of the present invention is directed to a power combiner for combining a first input signal with a second input signal. The power combiner includes: a first input terminal for receiving the first input signal; a second input terminal for receiving the second input terminal; a distributed constant line having a line length for inverting a phase of a fundamental wave component of the second input signal received by the second input terminal; a resonant circuit connected between the first input terminal and a point on the distributed constant line at which a phase of an even-ordered harmonic component desired to be canceled out is inverted, the resonant circuit series-resonating with a frequency of the even-ordered harmonic component desired to be canceled out; and a combining section for combining the first signal received by the first input terminal with a signal from the distributed constant line.

According to the fourth aspect, it is possible to provide a power combiner which suppresses generation of even-ordered harmonic distortion.

Preferably, the line length of the distributed constant line corresponds to a ½ wavelength of the fundamental wave, the point at which the resonant circuit is connected to the contributed constant line is at a distance of a ¼ wavelength of the fundamental wave from an end of the distributed constant line, and the resonant circuit series-resonates with a second-order harmonic frequency.

Thus, it is possible to provide a power combiner which suppresses generation of second-order harmonic distortion.

Preferably, the resonant circuit may be a series resonant circuit including inductors and one capacitor which are arranged in a symmetrical manner or including one inductor and capacitors which are arranged in a symmetrical manner. Thus, it is possible to prevent a mismatch between impedances seen from both ends of the resonant circuit.

Preferably, the resonant circuit may be a distributed constant line having an electrical length equal to a ½ wavelength of the even-ordered harmonic component desired to be canceled out. Thus, it is possible to prevent a mismatch between impedances seen from both ends of the resonant circuit, and also to reduce the number of elements used in used in the resonant circuit.

In the present invention, even-ordered harmonics generated in the first and second amplification elements are canceled out by one resonant circuit which series-resonates with a frequency of a desired even-numbered harmonic, and is connected to a point at which a phase of the even-ordered harmonic is inverted. Similar to the case of providing each of the two amplification elements used in the push-pull type power amplifier with a resonant circuit for suppressing generation of the even-ordered harmonic distortion, generation of even-ordered harmonic distortion can be suppressed by one resonant circuit, whereby it is possible to provide a compact power amplifier, a compact power distributor, and a power combiner.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described.

(First Embodiment)

Figure 1:
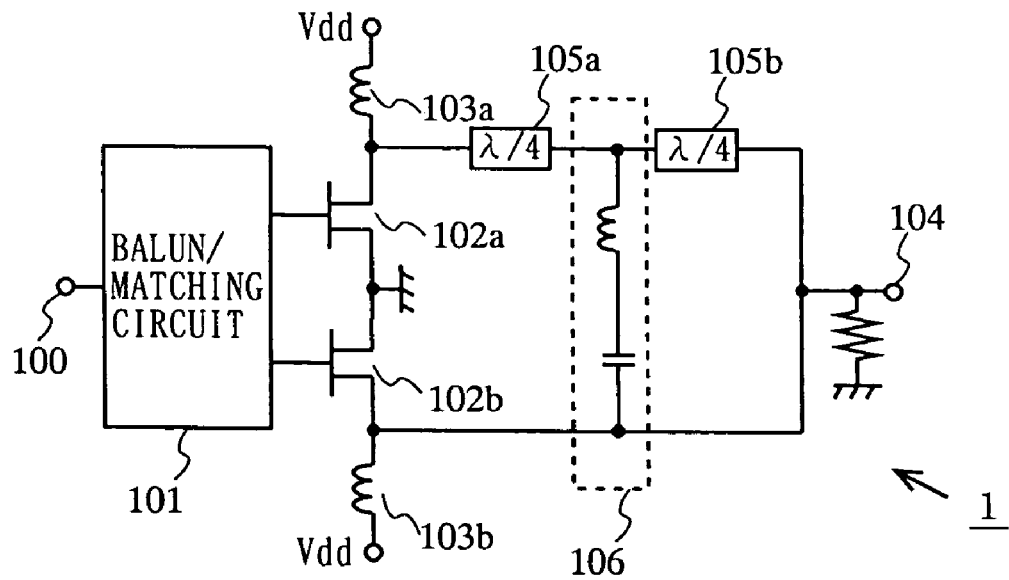
FIG. 1 is a diagram showing a structure of a power amplifier 1 according to a first embodiment of the present invention.

FIG. 1 is a diagram showing a structure of a power amplifier 1 according to a first embodiment of the present invention. In FIG. 1, the power amplifier 1 includes an input terminal 100; a balun/matching circuit 101; a first amplification element 102a; a second amplification element 102b; an inductor 103a connected to a drain of the first amplification element 102a; an inductor 103b connected to a drain of the second amplification element 102b; an output terminal 104; distributed constant lines 105a and 105b connected between the output terminal 104 and the drain of the first amplification element 102a; and a series resonant circuit 106. The first and second amplification elements 102a and 102b adhere to the same specification.

The series resonant circuit 106 is connected at one end between the distributed constant lines 105a and 105b so as to be in parallel connection with the distributed constant lines 105a and 105b. Further, the series resonant circuit 106 is connected at the other end between the drain of the second amplification element 102b and the output terminal 104 so as to be in parallel connection with the second amplification element 102b and the output terminal 104. The series resonant circuit 106 is configured so as to resonate with a second-order harmonic frequency which is equal to twice the frequency of a fundamental wave.

Where a fundamental wave component of a signal inputted into the input terminal 100 has a wavelength of $\lambda$, the length of each of the distributed constant lines 105a and 105b corresponds to a quarter of the wavelength of the fundamental wave, i.e., $\lambda/4$. In FIG. 1, for simplification of illustration, the distributed constant lines 105a and 105b are shown so as to be separated from each other. However, in actuality, the distributed constant lines 105a and 105b are integrally provided so as to form one distributed constant line having a length corresponding to a ½ wavelength of the fundamental wave. A connection point of the series resonant circuit 106 to the distributed constant line is located at a distance of a ¼ wavelength of the fundamental wave from a side close to the drain of the first amplification element 102a.

The balun/matching circuit 101 is operable to invert the phase of the fundamental wave inputted into the input terminal 100 and to output first and second signals having fundamental wave components inverted in phase with respect to each other. The first and second amplification elements 102a and 102b are used for amplifying the first and second signals having fundamental wave components inverted in phase with respect to each other and outputted from the balun/matching circuit 101. In the distributed constant lines 105a and 105b, a signal outputted from the first amplification element 102a is shifted in phase by 180 degrees, and then combined with a signal outputted from the second amplification element 102b. A resultant signal is outputted from the output terminal 104.

Second-order harmonics generated by the first and second amplification elements 102a and 102b are in the same phase as each other. Where a fundamental wave frequency is f0, a wavelength of $\lambda 2$ of the second-order harmonic is ½f0. Accordingly, the line length of the distributed constant line 105a corresponds to a ½ wavelength of the second-order harmonic. Therefore, the distributed constant line 105a shifts the phase of the second-order harmonic by 180 degrees. Since the series resonant circuit 106 is configured so as to resonate with the second-order harmonic frequency, the second-order harmonic having its phase shifted by 180 degrees by means of the distributed constant line 105a cancels out the second-order harmonic outputted from the second amplification element 102b. Thus, the power amplifier 1 is able to suppress second-order distortion.

(Second Embodiment)

Figure 2:
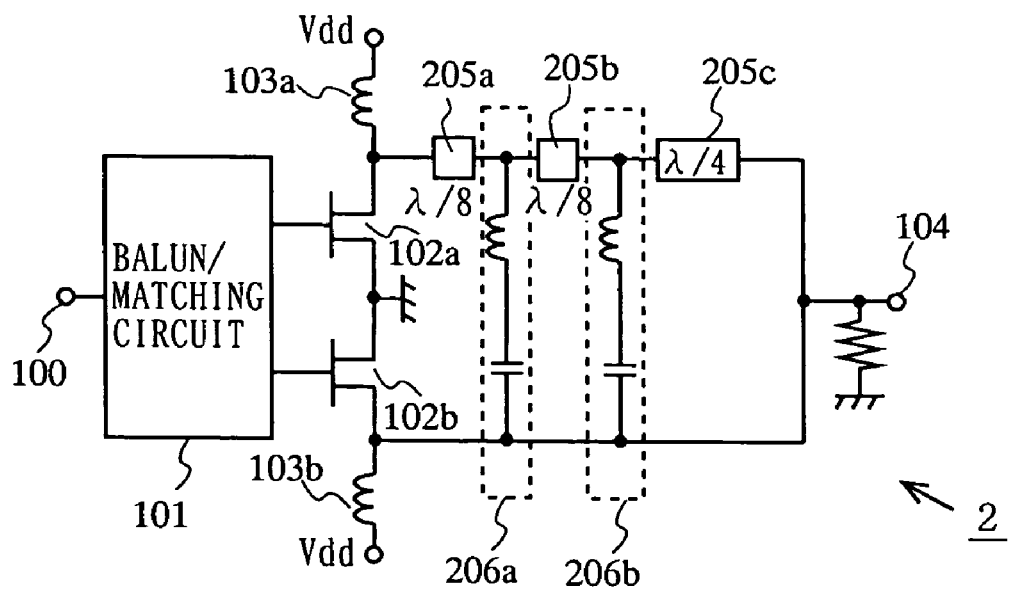
FIG. 2 is a diagram showing a structure of a power amplifier 2 according to a second embodiment of the present invention.

FIG. 2 is a diagram showing a structure of a power amplifier 2 according to a second embodiment of the present invention. In FIG. 2, the power amplifier 2 includes the input terminal 100; the balun/matching circuit 101; the first amplification element 102a; the second amplification element 102b; the inductor 103a connected to the drain of the first amplification element 102a; the inductor 103b connected to the drain of the second amplification element 102b; the output terminal 104; distributed constant lines 205a, 205b, and 205c connected between the output terminal 104 and the drain of the first amplification element 102a; and series resonant circuits 206a and 206b. In FIG. 2, elements similar to those of the power amplifier 1 are denoted by the same reference numerals as those shown in FIG. 1, and detailed descriptions thereof are omitted here.

The series resonant circuit 206a is connected at one end between the distributed constant lines 205a and 205b so as to be in parallel connection with the distributed constant lines 205a and 205b. Further, the series resonant circuit 206a is connected at the other end between the drain of the second amplification element 102b and the output terminal 104 so as to be in parallel connection with the second amplification element 102b and the output terminal 104. The series resonant circuit 206a is configured so as to resonate with a fourth-order harmonic frequency which is equal to four times the frequency of a fundamental wave.

The series resonant circuit 206b is connected at one end between the distributed constant lines 205b and 205c so as to be in parallel connection with the distributed constant lines 205b and 205c. Further, the series resonant circuit 206b is connected at the other end between the drain of the second amplification element 102b and the output terminal 104 so as to be in parallel connection with the second amplification element 102b and the output terminal 104. The series resonant circuit 206b is configured so as to resonate with a second-order harmonic which is equal to twice the frequency of the fundamental wave.

The length of each of the distributed constant lines 205a and 205b corresponds to a ⅛ wavelength of the fundamental wave. The length of the distributed constant line 205c corresponds to a ¼ wavelength of the fundamental wave. In FIG. 2, for simplification of illustration, the distributed constant lines 205a, 205b, and 205c are shown so as to be separated from each other. However, in actuality, the distributed constant lines 205a, 205b, and 205c are integrally provided so as to form one distributed constant circuit having a length corresponding to a ½ wavelength of the fundamental wave. A connection point of the series resonant circuit 206a to the distributed constant line is located at a distance of a ⅛ wavelength of the fundamental wave from a side close to the drain of the first amplification element 102a. A connection point of the series resonant circuit 206b to the distributed constant line is located at a distance of a ¼ wavelength of the fundamental wave from the side close to the drain of the first amplification element 102a.

In the distributed constant line formed by the distributed constant lines 205a, 205b, and 205c, a fundamental wave outputted from the first amplification element 102a is shifted in phase by 180 degrees, and then combined with another fundamental wave outputted from the second amplification element 102b. A resultant signal is outputted from the output terminal 104.

Further, in a portion of the distributed constant line corresponding to the distributed constant lines 205a and 205b, a second-order harmonic is shifted in phase by 180 degrees. Since the series resonant circuit 206b is configured so as to resonate with the second-order harmonic frequency, the second-order harmonic having its phase shifted by 180 degrees cancels out a second-order harmonic outputted from the second amplification element 102b. Thus, the power amplifier 2 is able to suppress second-order distortion.

The distributed constant line 205a shifts a fourth-order harmonic by 180 degrees. Since the series resonant circuit 206a is configured so as to resonate with a fourth-order harmonic frequency, the fourth-order harmonic shifted in phase by 180 degrees cancels out a fourth-order harmonic outputted from the second amplification element 102b. Thus, the power amplifier 2 is able to suppress fourth-order distortion.

In examples shown in FIGS. 1 and 2, as a circuit for canceling out an even-ordered harmonic desired to be canceled out, a power amplifier of the present invention includes a series resonant circuit which resonates with a frequency of the even-ordered harmonic and is provided in a predetermined position such that an output from an amplification element encounters an output from another amplification element. As a result, the series resonant circuit cancels out the even-ordered harmonic, thereby suppressing generation of even-ordered harmonic distortion.

Note that the balun/matching circuit may have a power combining configuration including a series resonant circuit as shown in FIG. 1 or 2, so as to output first and second signals having fundamental wave components inverted in phase with respect to each other.

Note that although the power amplifiers shown in FIGS. 1 and 2 are configured so as to suppress a second-order harmonic and/or a fourth-order harmonic, a power amplifier configured in a manner similar to the power amplifiers shown in FIGS. 1 and 2 may be used for suppressing an even-ordered harmonic other than the second- and fourth-order harmonics. Specifically, in order to suppress 2n'th-order harmonic (where n is a natural number), a series resonant circuit, which resonates with a frequency of an even-ordered harmonic desired to be canceled out, may be connected to a distributed constant line at a distance of a ¼n wavelength of the fundamental wave from a side close to an output end of an amplification terminal.

Note that a connection point of the series resonant circuit to the distributed constant line may be located at a distance of a ¼n wavelength of the fundamental wave from an output terminal of the distributed constant line, rather than at the distance of a ¼n wavelength of the fundamental wave from the side close to the output end of the amplification terminal.

Note that a desired effect can be achieved by connecting at least one series resonant circuit to the distributed constant line.

Note that at a λ/4 location where the phase of a second-order harmonic is inverted, phases of even-ordered harmonics other than the second-order harmonic are also inverted. Accordingly, by providing a stub to the power amplifier 1 shown in FIG. 1, such that the series resonant circuit 106 also series-resonates with a frequency of an even-ordered harmonic other than the second-order harmonic, it is made possible to cancel out the even-ordered harmonic other than the second-order harmonic. Similarly, by providing a stub to the power amplifier 2 shown in FIG. 2, such that the series resonant circuit 206a or 206b also series-resonates with a frequency of an even-ordered harmonic other than the second-order harmonic, it is made possible to cancel out the even-ordered harmonic other than the second-order harmonic. Thus, a desired effect can be achieved.

(EXAMPLES)

Hereinafter, examples of the present invention will be described.

Figure 3:
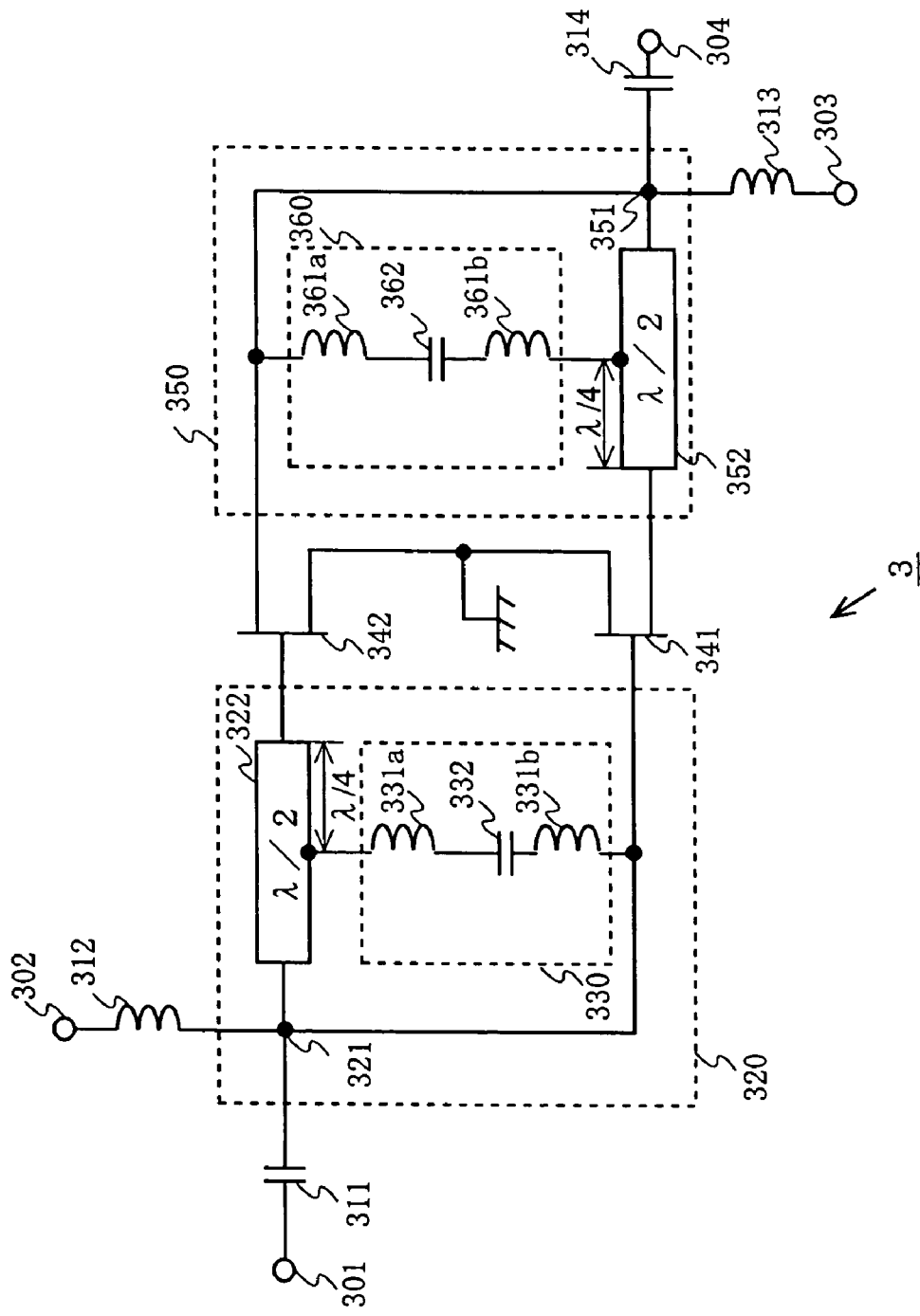
FIG. 3 is a circuit diagram showing an exemplary power amplifier of the present invention.

FIG. 3 is a circuit diagram showing an exemplary power amplifier of the present invention. In FIG. 3, a power amplifier 3 includes an input terminal 301, a gate bias terminal 302, a drain bias terminal 303, an output terminal 304, an input coupling capacitor 311, a gate bias inductor 312, a drain bias inductor 313, an output coupling capacitor 314, a first field-effect transistor (FET) 341, a second FET 342, a combining terminal 351, a first distributed constant line 352, an inductor 361a, a capacitor 362, an inductor 361b, a distribution terminal 321, a second distributed constant line 322, an inductor 331a, a capacitor 332, and an inductor 331b.

A source of each of the first and second FETs 341 and 342 is grounded. The first and second FETs 341 and 342 are equivalent to the first and second amplification elements 102a and 102b, respectively, of the first embodiment (see FIG. 1).

The second FET 342 has a drain connected to the coupling terminal 351. The first distributed constant line 352 is connected between a drain of the first FET 341 and the coupling terminal 351. The first distributed constant line 352 has a length corresponding to a ½ wavelength of a fundamental wave. A series of the inductor 361b, the capacitor 362, and the inductor 361a are connected to the first distributed constant line 352 at a point at a distance of a ¼ wavelength of the fundamental wave from a side close to a gate of the first FET 341. The inductor 361a is connected at one end between the coupling terminal 351 and the drain of the second FET 342 so as to be in parallel connection with the combining terminal 351 and the second FET 342.

The inductor 361a, the capacitor 362, and the inductor 361b form a first series resonant circuit 360. Values of the inductor 361a, the capacitor 362, and the inductor 361b are set such that the first series resonant circuit 360 series-resonates with a frequency equal to twice the frequency of the fundamental wave. Note that the first series resonant circuit 360 is equivalent to the series resonant circuit 106 of the first embodiment (see FIG. 1). The first series resonant circuit 360, the first distributed constant line 352, and the coupling terminal 351 form a power combiner 350. In the first resonant circuit 360, inductors and a capacitor are arranged in a symmetric manner such that the inductors are connected to opposite sides of the capacitor, and therefore impedances seen from both ends of the first series resonant circuit 360 are made to be equivalent to each other, thereby preventing an impedance mismatch. A similar effect can be achieved by arranging an inductor and capacitors in a symmetric manner such that the capacitors are connected to opposite sides of the inductor.

The drain bias inductor 313 is connected between the coupling terminal 351 and the drain bias terminal 303. The output coupling capacitor 314 is connected between the coupling terminal 351 and the output terminal 304.

The input coupling capacitor 311 is connected between the input terminal 301 and the distribution terminal 321. The gate bias inductor 312 is connected between the gate bias terminal 302 and the distribution terminal 321.

The second distributed constant line 322 is connected between the distribution terminal 321 and the second FET 342. The distribution terminal 321 is connected to the gate of the first FET 341. The second distributed constant line 322 has a length corresponding to a ½ wavelength of the fundamental wave. A series of the inductor 331a, the capacitor 332, and the inductor 331b are connected to the second distributed constant line 322 at a point at a distance of a ¼ wavelength of the fundamental wave from a side close to a gate of the second FET 342. The inductor 331b is connected at one end between the distribution terminal 321 and the gate of the first FET 341 so as to be in parallel connection with the distribution terminal 321 and the first FET 341.

The inductor 331a, the capacitor 332, and the inductor 331b form a second series resonant circuit 330. Values of the inductor 331a, the capacitor 332, and the inductor 331b are set such that the second series resonant circuit 330 series-resonates with a frequency equal to twice the frequency of the fundamental wave. The second series resonant circuit 330, the second distributed constant line 322, and the distribution terminal 321 form a power distributor 320. Note that the power distributor 320 is equivalent to the balun/matching circuit 101 of the first embodiment (see FIG. 1). In the second series resonant circuit 330, inductors and a capacitor are arranged in a symmetric manner such that the inductors are connected to opposite sides of the capacitor, and therefore impedances seen from both ends of the second series resonant circuit 330 are made to be equivalent to each other, thereby preventing an impedance mismatch. A similar effect can be achieved by arranging an inductor and capacitors in a symmetric manner such that the capacitors are connected to opposite sides of the inductor.

An operation of the power amplifier 3 shown in FIG. 3 is now described.

A fundamental wave inputted into the input terminal 301 passes through the input coupling capacitor 311 to the distribution terminal 321 of the power distributor 320, and is separated into first and second signals. The second signal passes from the distribution terminal 321 through the second distributed constant line 322, which has a length corresponding to a ½ wavelength of the fundamental wave, to the gate of the second FET 342. The first signal is directly inputted from the distribution terminal 321 to the gate of the first FET 341.

The second distributed constant line 322 shifts phases of a fundamental wave component and an odd-ordered harmonic component of the second signal by 180 degrees. Accordingly, regarding the fundamental wave component and the odd-ordered harmonic, a signal inputted into the gate of the second FET 342 and a signal inputted into the gate of the first FET 341 are inverted in phase with respect to each other, and as for even-ordered harmonic components, such signals are in phase with each other. Note that a gate bias is applied from the gate bias terminal 302 through the gate bias inductor 312 to the distribution terminal 321.

The second series resonant circuit 330 is connected to the second distributed constant line 322 at a point at a distance of a ¼ wavelength of the fundamental wave, i.e., a ½ wavelength of a second-order harmonic, from a side close to the gate of the second FET 342. Accordingly, at the connection between the second series resonant circuit 330 and the second distributed constant line 322, the phase of the second-order harmonic is shifted by 180 degrees, and therefore the second-order harmonics at opposite ends of the second series resonant circuit 330 are 180 degrees out of phase with each other. The second series resonant circuit 330 is configured so as to series-resonate with a second-order harmonic frequency, and therefore acts as a short-circuit for the second-order harmonic. Therefore, the second-order harmonic is canceled out. Thus, there is substantially no second-order harmonic at the gates of the first and second FETs 341 and 342.

The second signal is amplified by the second FET 342, and inputted into the combining terminal 351, while the first signal is amplified by the first FET 341, and inputted into the combining terminal 351 via the first distributed constant line 352 having a length corresponding to a ½ wavelength of the fundamental wave. The first distributed constant line 352 shifts phases of a fundamental wave component and an odd-ordered harmonic component of the first signal by 180 degrees. Accordingly, regarding the fundamental wave component and the odd-ordered harmonic, the second signal outputted from the second FET 342 and the first signal outputted from the first FET 341 are in phase with each other at the combining terminal 351. Note that a drain bias is applied from the drain bias terminal 303 through the drain bias inductor 313 to the combining terminal 351.

The first series resonant circuit 360 is connected to the first distributed constant line 352 at a point at a distance of a ¼ wavelength of the fundamental wave, i.e., a ½ wavelength of a second-order harmonic, from a side close to the drain of the first FET 341. Accordingly, at the connection between the first series resonant circuit 360 and the first distributed constant line 352, the phase of the second-order harmonic is shifted by 180 degrees. Since the second-order harmonic of a signal outputted from the first amplification element 341 is in phase with the second-order harmonic of a signal outputted from the second amplification element 342, the second-order harmonics at opposite ends of the first series resonant circuit 360 are 180 degrees out of phase with each other. The first series resonant circuit 360 is configured so as to series-resonate with a second-order harmonic frequency, and therefore acts as a short-circuit for the second-order harmonic. Therefore, the second-order harmonic is canceled out. Thus, there is substantially no second-order harmonic at the drains of the first and second FETs 341 and 342.

As described above, in a power amplifier having a circuit configuration as shown in FIG. 3, there is substantially no second-order harmonic at input and output ends of two FETs. Accordingly, high-frequency distortion can be suppressed, and therefore high efficiency can be achieved. In order to cancel out the second-order harmonic, it is merely required to provide a series resonant circuit on a power distributor side and another series resonant circuit on a power combiner side, resulting in a reduction in size of the power amplifier. Further, one series resonant circuit is provided as a short-circuit for the second-order harmonic in each of the power distributor and the power combiner, and therefore variation of short-circuit power can be eliminated, resulting in a reduction of a power characteristic variation of the power amplifier.

Figure 4:
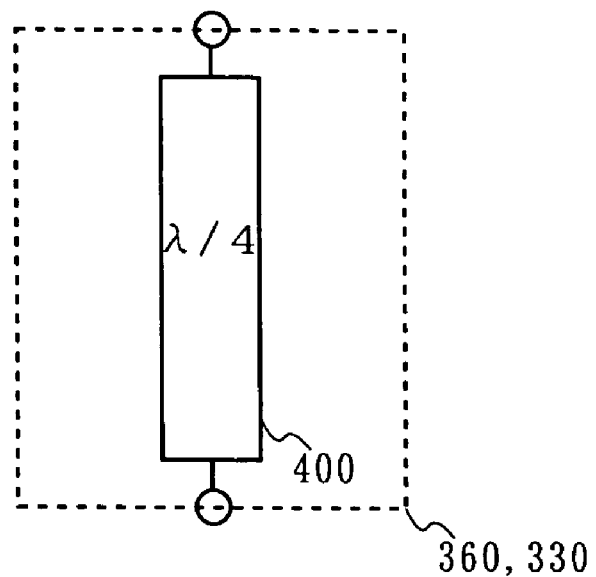
FIG. 4 is a diagram used for explaining an exemplary case where first or second series resonant circuit 360 or 330 is configured as a distributed constant line 400.

Note that each or either of the first and second series resonant circuit 360 and 330 may be a distributed constant circuit. FIG. 4 is a diagram used for explaining an exemplary case where the first or second series resonant circuit 360 or 330 is configured as a distributed constant line 400. In FIG. 4, the distributed constant line 400 has an electrical length equal to a ¼ wavelength of a fundamental wave (i.e., the electrical length is equal to a ½ wavelength of a second-order harmonic). Second-order harmonics at opposite ends of the distributed constant line 400 are 180 degrees out of phase with each other, and therefore cancel out each other.

There is a difficulty in successfully controlling high frequency harmonic impedances at opposite ends of a series resonant circuit including passive elements, such as an inductor, a capacitor, etc. However, in the case of a series resonant circuit including a distributed constant line, it is possible to readily control the high frequency harmonic impedances at opposite ends of the distributed constant line with high accuracy. Accordingly, by providing a distributed constant line to a series resonant circuit, it is made possible to cancel out even high frequency harmonic components.

Although it is preferred that, as shown in FIG. 3, passive elements in the series resonant circuit are arranged in a symmetrical manner, the symmetrical arrangement increases the number of the passive elements. However, the distributed constant line allows impedances seen from both ends of the series resonant circuit to be equivalent to each other, thereby preventing an impedance mismatch. This leads to a reduction in number of elements used in the series resonant circuit.

In the example shown in FIG. 3, a series resonant circuit is provided as a short-circuit for a second-order harmonic in each of the power distributor and the power combiner. However, only one series resonant circuit may be provided in either the power distributor or the power combiner.

Note that the power distributor and the power combiner shown in FIG. 3 can be separately provided as individual elements. These elements are not limited to those specialized for use in a push-pull type power amplifier.

Note that the first an second series resonant circuits 360 and 330 each may be configured so as to simultaneously series-resonate with a second-order harmonic and an even-numbered harmonic other than the second-order harmonic. This suppresses generation of even-numbered harmonics other than the second order-harmonic, thereby achieving a high efficiency of the series resonant circuit.

The first and second series resonant circuits 360 and 330 may be connected to the first and second distributed constant lines 352 and 322, respectively, at a point at a distance of a ½ wavelength of an even-numbered harmonic from one end of the line. This suppresses generation of an even-ordered harmonic desired to be canceled out.

Figure 5:
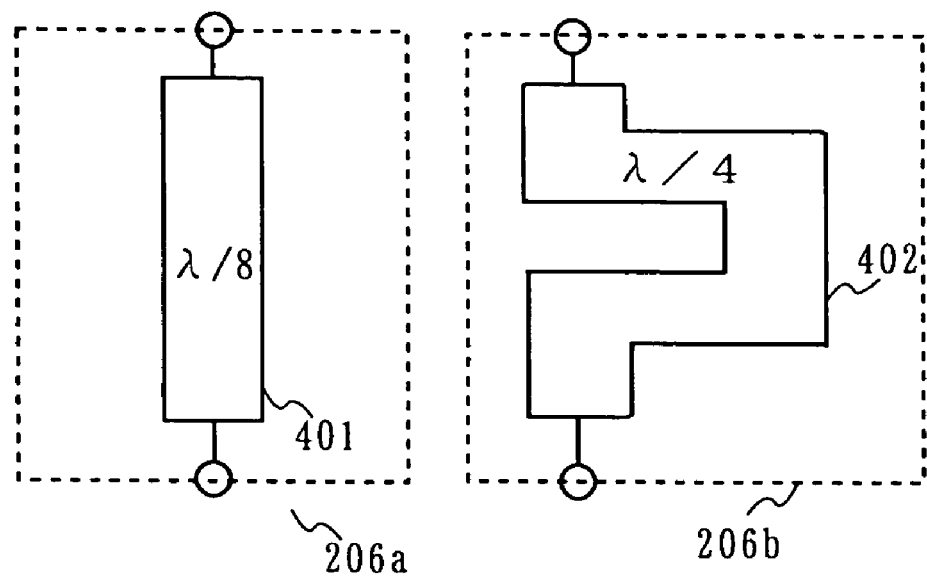
FIG. 5 is a diagram showing an example where distributed constant lines are used as series resonant circuits to suppress generation of second- and fourth-order harmonics.
Figure 6:
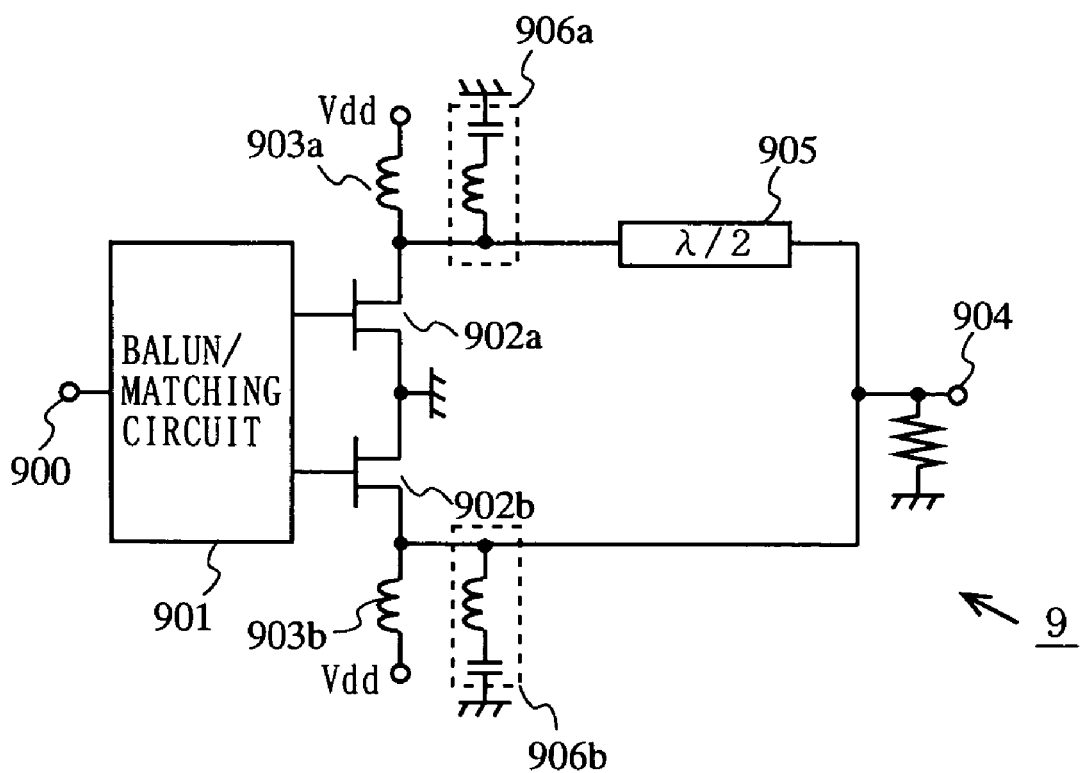
FIG. 6 is a diagram showing a structure of a conventional push-pull type high frequency power amplifier.
Figure 7:
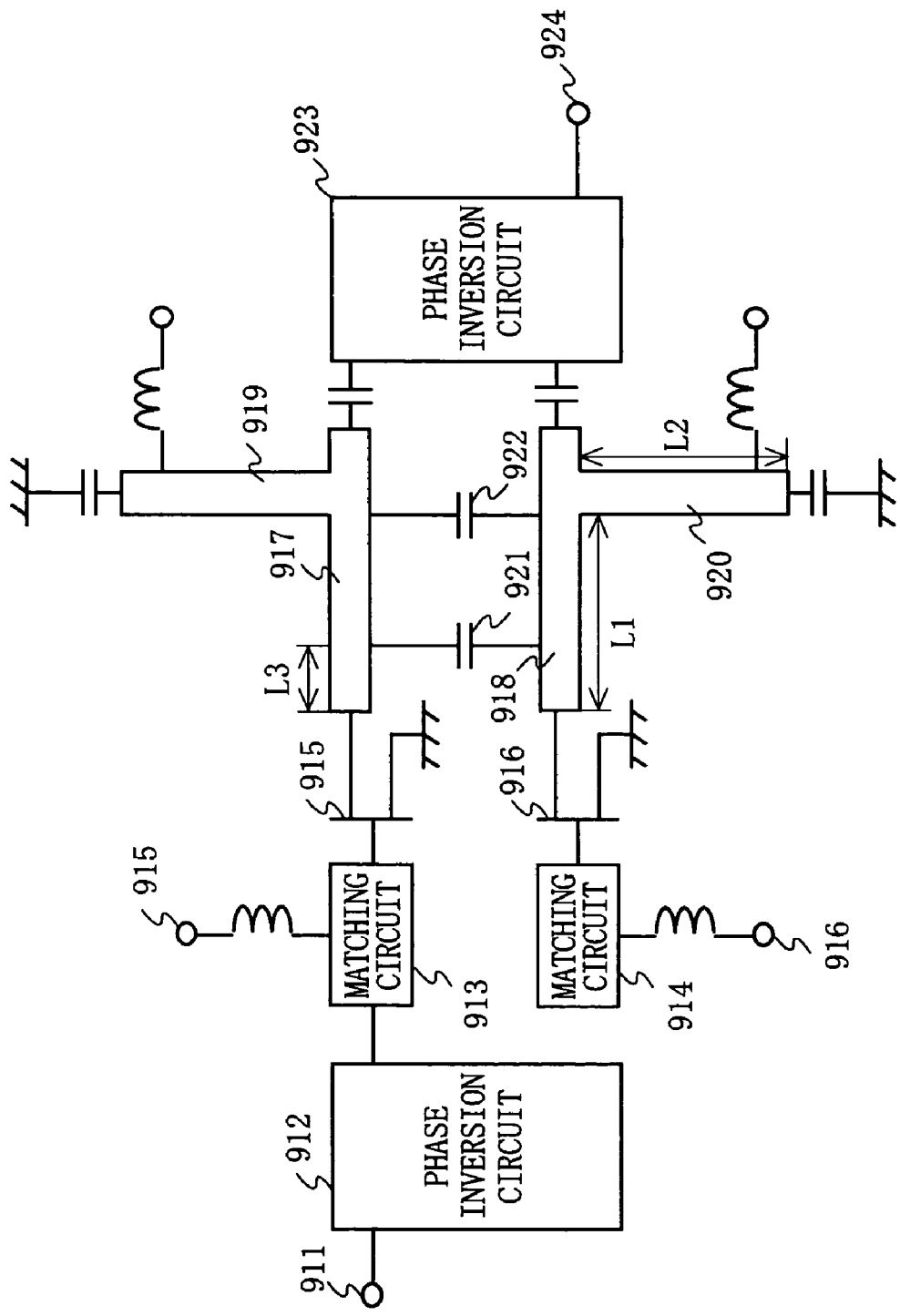
FIG. 7 is a diagram showing a structure of a conventional push-pull type power amplifier including a matching circuit with consideration of a harmonic impedance.
Figure 8:
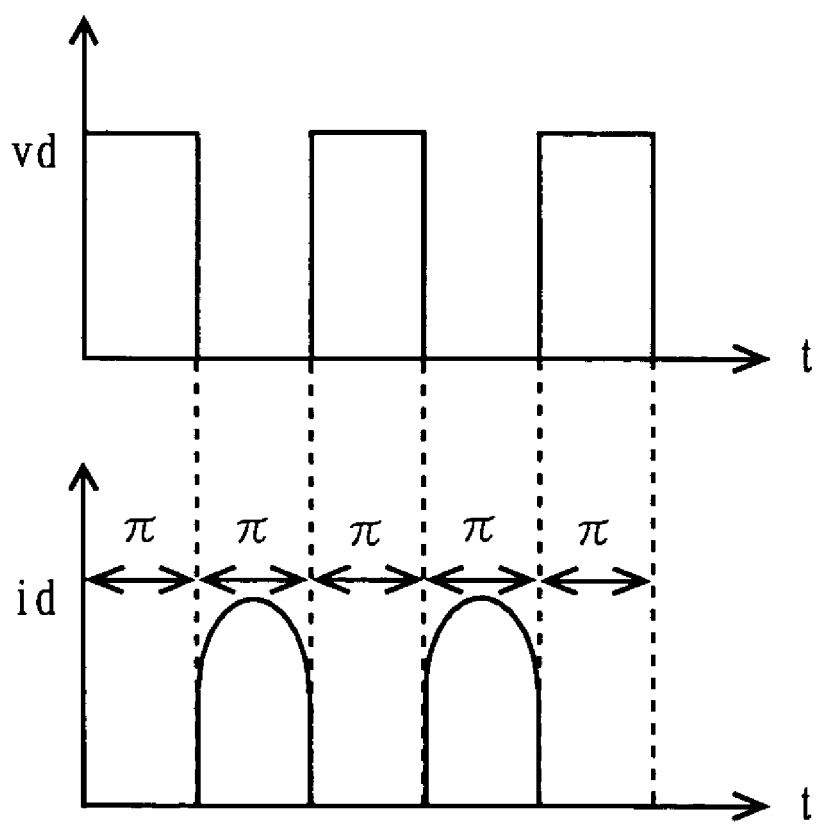
FIG. 8 is a diagram showing waveforms of a drain voltage vd and a drain current id of an FET included in the power amplifier shown in FIG. 7.

For example, it is conceivable to use distributed constant lines as the series resonant circuits to suppress generation of second- and fourth-order harmonics. FIG. 5 is a diagram showing an example where distributed constant lines are used as the series resonant circuits to suppress generation of second- and fourth-order harmonics. In FIG. 5, a distributed constant line 401 has an electrical length equal to a ⅛ wavelength of a fundamental wave (i.e., the electrical length is equal to a ½ wavelength of a fourth-order harmonic). The distributed constant line 401 plays a roll of the series resonant circuit 206a shown in FIG. 2. A distributed constant line 402 has an electrical length equal to a ¼ wavelength of a fundamental wave (i.e., the electrical length is equal to a ½ wavelength of a second-order harmonic). The distributed constant line 402 plays a roll of the series resonant circuit 206b shown in FIG. 2. By providing the distributed constant lines, which resonate with even-ordered harmonics desired to be canceled out, instead of using the series resonant circuits each including passive elements as shown in FIG. 2, it is made possible to suppress generation of the even-ordered harmonics, thereby achieving a high efficiency of the entire circuit including the distributed constant lines. Note that a distributed constant line, which resonates with an even-ordered harmonic desired to be canceled out, is configured so as to have an electrical length equal to a ½ wavelength of the even-ordered harmonic desired to be canceled out. Note that the longer distributed constant line 402 may be bent as shown in FIG. 5 so as to have its ends aligned with ends of the shorter distributed constant line 401. Alternatively, in order to have the ends of the longer line aligned with the ends of the shorter lines, these lines may be arranged to cross each other at different levels. Note that it is possible to prevent generation of other even-ordered harmonics in a similar manner as described for the even-ordered harmonic desired to be canceled out.

A higher efficiency can be achieved by combining the above-described configuration with a circuit for controlling an odd-ordered harmonic.

The present invention provides a power amplifier, a power distributor, and a power combiner which are advantageous in the field of communication apparatuses and the like because of their compact size, narrow range of characteristic variation, and high efficiency.

While the invention has been described in detail, the foregoing description is in all aspects illustrative and not restrictive. It is understood that numerous other modifications and variations can be devised without departing from the scope of the invention.

What is claimed is:

1. A power amplifier for amplifying a high frequency signal, the amplifier comprising:
   a first amplification element for amplifying a first signal;
   a second amplification element for amplifying a second signal in reverse phase with respect to the first signal, wherein the second amplification element is connected to the first amplification element in a push-pull configuration;
   a first distributed constant line having a line length for inverting a phase of a fundamental wave component of the first signal amplified by the first amplification element;
   a first resonant circuit connected between an output end of the second amplification element and a point on the first distributed constant line at which a phase of an even-ordered harmonic component desired to be canceled out is inverted, wherein the first resonant circuit series-resonates with a frequency of the even-ordered harmonic component desired to be canceled out; and
   an output terminal for outputting a combined signal obtained by combining a signal from the first distributed constant line with a signal from the second amplification element.

2. The power amplifier according to claim 1,
   wherein the line length of the first distributed constant line corresponds to a ½ wavelength of the fundamental wave,
   wherein the point at which the first resonant circuit is connected to the first contributed constant line is at a distance of a ¼ wavelength of the fundamental wave from an end of the first distributed constant line, and
   wherein the first resonant circuit series-resonates with a second-order harmonic frequency.

3. The power amplifier according to claim 2, wherein the first resonant circuit is a series resonant circuit including inductors and one capacitor which are arranged in a symmetrical manner or including one inductor and capacitors which are arranged in a symmetrical manner.

4. The power amplifier according to claim 1, wherein the first resonant circuit is a distributed constant line having an electrical length equal to a ½ wavelength of the even-ordered harmonic component desired to be canceled out.

5. The power amplifier according to claim 1, further comprising a power distributor for inputting the first and second signals into the first and second amplification elements, respectively,
   wherein the power distributor includes:
   a distribution section for separating an inputted signal into two signals and for inputting one of the two signals as the first signal into the first amplification element;
   a second distributed constant line having a line length for inverting a phase of a fundamental wave component of another one of the two signals from the distribution section, and inputting the fundamental wave component, which has its phase inverted, as the second signal into the second amplification element; and
   a second resonant circuit connected between an input end of the second amplification element and a point on the second distributed constant line at which a phase of an even-ordered harmonic component desired to be canceled out is inverted, wherein the second resonant circuit series-resonates with a frequency of the even-ordered harmonic component desired to be canceled out.

6. The power amplifier according to claim 5,
   wherein the line length of the second distributed constant line corresponds to a ½ wavelength of the fundamental wave,
   wherein the point at which the second resonant circuit is connected to the second contributed constant line is at a distance of a ¼ wavelength of the fundamental wave from an end of the second distributed constant line, and
   wherein the second resonant circuit series-resonates with a second-order harmonic frequency.

7. The power amplifier according to claim 6, wherein the second resonant circuit is a series resonant circuit including inductors and one capacitor which are arranged in a symmetrical manner or including one inductor and capacitors which are arranged in a symmetrical manner.

8. The power amplifier according to claim 5, wherein the second resonant circuit is a distributed constant line having an electrical length equal to a ½ wavelength of the even-ordered harmonic component desired to be canceled out.

9. A power amplifier for amplifying a high frequency signal, the amplifier comprising:
   a power distributor for outputting a first signal and a second signal in reverse phase with respect to the first signal;
   a first amplification element for amplifying the first signal;
   a second amplification element for amplifying the second signal, wherein the second amplification element is connected to the first amplification element in a push-pull configuration; and
   a power combiner for inverting a phase of a fundamental wave component of the first signal amplified by the first amplification element and outputting a combined signal obtained by combining the first signal having its fundamental wave inverted in phase with the second signal amplified by the second amplification element,
   wherein the power distributor includes:
   a distribution section for separating an inputted signal into two signals and for inputting one of the two signals as the first signal into the first amplification element;
   a distributed constant line having a line length for inverting a phase of a fundamental wave component of another one of the two signals from the distribution section, and inputting the fundamental wave component, which has its phase inverted, as the second signal into the second amplification element; and a resonant circuit connected between the input end of the second amplification element and a point on the distributed constant line at which a phase of an even-ordered harmonic component desired to be canceled out is inverted, wherein the resonant circuit series-resonates with a frequency of the even-ordered harmonic component desired to be canceled out.

10. The power amplifier according to claim 9, wherein the line length of the distributed constant line corresponds to a ½ wavelength of the fundamental wave, wherein the point at which the resonant circuit is connected to the contributed constant line is at a distance of a ¼ wavelength of the fundamental wave from an end of the distributed constant line, and wherein the resonant circuit series-resonates with a second-order harmonic frequency.

11. The power amplifier according to claim 10, wherein the resonant circuit is a series resonant circuit including inductors and one capacitor which are arranged in a symmetrical manner or including one inductor and capacitors which are arranged in a symmetrical manner.

12. The power amplifier according to claim 9, wherein the resonant circuit is a distributed constant line having an electrical length equal to a ½ wavelength of the even-ordered harmonic component desired to be canceled out.

13. A power distributor for separating an inputted signal into two signals, the distributor comprising:

a distribution section for separating the inputted signal into the two signals;

a first output terminal for outputting, as a first signal, one of the two signals obtained by separation via the distribution section;

a distributed constant line having a line length for inverting a phase of a fundamental wave component of another one of the two signals obtained by separation via the distribution section, thereby converting the fundamental wave, which has its phase inverted, into a second signal;

a second output terminal for outputting the second signal derived from the distributed constant line; and a resonant circuit connected between the first output terminal and a point on the distributed constant line at which a phase of an even-ordered harmonic component desired to be canceled out is inverted, wherein the resonant circuit series-resonates with a frequency of the even-ordered harmonic component desired to be canceled out.

14. The power distributor according to claim 13, wherein the line length of the distributed constant line corresponds to a ½ wavelength of the fundamental wave, wherein the point at which the resonant circuit is connected to the contributed constant line is at a distance of a ¼ wavelength of the fundamental wave from an end of the distributed constant line, and wherein the resonant circuit series-resonates with a second-order harmonic frequency.

15. The power distributor according to claim 14, wherein the resonant circuit is a series resonant circuit including inductors and one capacitor which are arranged in a symmetrical manner or including one inductor and capacitors which are arranged in a symmetrical manner.

16. The power distributor according to claim 13, wherein the resonant circuit is a distributed constant line having an electrical length equal to a ½ wavelength of the even-ordered harmonic component desired to be canceled out.

17. A power combiner for combining a first input signal with a second input signal, the combiner comprising:

a first input terminal for receiving the first input signal;

a second input terminal for receiving the second input terminal;

a distributed constant line having a line length for inverting a phase of a fundamental wave component of the second input signal received by the second input terminal;

a resonant circuit connected between the first input terminal and a point on the distributed constant line at which a phase of an even-ordered harmonic component desired to be canceled out is inverted, wherein the resonant circuit series-resonates with a frequency of the even-ordered harmonic component desired to be canceled out; and a combining section for combining the first signal received by the first input terminal with a signal from the distributed constant line.

18. The power combiner according to claim 17, wherein the line length of the distributed constant line corresponds to a ½ wavelength of the fundamental wave, wherein the point at which the resonant circuit is connected to the contributed constant line is at a distance of a ¼ wavelength of the fundamental wave from an end of the distributed constant line, and wherein the resonant circuit series-resonates with a second-order harmonic frequency.

19. The power combiner according to claim 18, wherein the resonant circuit is a series resonant circuit including inductors and one capacitor which are arranged in a symmetrical manner or including one inductor and capacitors which are arranged in a symmetrical manner.

20. The power combiner according to claim 17, wherein the resonant circuit is a distributed constant line having an electrical length equal to a ½ wavelength of the even-ordered harmonic component desired to be canceled out.

* * * * *

UNITED STATES PATENT AND TRADEMARK OFFICE
CERTIFICATE OF CORRECTION

PATENT NO.         : 6,980,057 B2
APPLICATION NO. : 10/872380
DATED              : December 27, 2005
INVENTOR(S)       : Shigeru Morimoto et al.

It is certified that error appears in the above-identified patent and that said Letters Patent is hereby corrected as shown below:

ON THE TITLE PAGE, ITEM (57) ABSTRACT,

Line 6, change "connected a tone" to --connected at one--.

Signed and Sealed this

Fifteenth Day of August, 2006

JON W. DUDAS
*Director of the United States Patent and Trademark Office*